US012660531B2

(12) United States Patent
Goto et al.

(10) Patent No.: US 12,660,531 B2
(45) Date of Patent: Jun. 16, 2026

(54) METHOD OF MANUFACTURING Si-SiC-BASED COMPOSITE STRUCTURE

(71) Applicants: NGK Insulators, Ltd., Nagoya-City (JP); NGK ADREC CO., LTD., Mitake Cho (JP)

(72) Inventors: Sora Goto, Komaki-City (JP); Shuhei Kuno, Komaki-City (JP); Daisuke Kimura, Nagoya-City (JP); Hiroomi Matsuba, Mizunami (JP)

(73) Assignees: NGK INSULATORS, LTD., Nagoya (JP); NGK ADREC CO., LTD., Mitake Cho (JP)

( * ) Notice: Subject to any disclaimer, the term of this patent is extended or adjusted under 35 U.S.C. 154(b) by 586 days.

(21) Appl. No.: 18/166,049

(22) Filed: Feb. 8, 2023

(65) Prior Publication Data

US 2023/0298882 A1 Sep. 21, 2023

(30) Foreign Application Priority Data

Mar. 17, 2022 (JP) ................................. 2022-042702

(51) Int. Cl.
*H10P 14/69* (2026.01)
*H10P 14/60* (2026.01)

(52) U.S. Cl.
CPC ...... *H10P 14/6905* (2026.01); *H10P 14/6322* (2026.01)

(58) Field of Classification Search
CPC ......... H01L 21/02167; H01L 21/02255; C04B 38/0009; C04B 35/565; C04B 35/622;

C04B 35/66; C04B 38/0006; C04B 41/5096; C04B 41/85; F28F 21/00; H10P 14/6905; H10P 14/6322
See application file for complete search history.

(56) References Cited

U.S. PATENT DOCUMENTS

| | | | |
|---|---|---|---|
| 5,324,692 A | 6/1994 | Benker et al. | |
| 11,866,378 B2 | 1/2024 | Ishiguro et al. | |
| 2020/0399185 A1* | 12/2020 | Ishiguro ................. | C04B 41/87 |

FOREIGN PATENT DOCUMENTS

| | | |
|---|---|---|
| CN | 104098339 A | 10/2014 |
| DE | 40 25 239 C1 | 12/1991 |
| EP | 3 766 858 A1 | 1/2021 |

(Continued)

OTHER PUBLICATIONS

Chinese Office Action (with English translation) dated Feb. 6, 2024 (Application No. 202310124177.1).

(Continued)

*Primary Examiner* — Julia Slutsker
(74) *Attorney, Agent, or Firm* — BURR PATENT LAW, PLLC

(57) ABSTRACT

Provided is a method of manufacturing a Si—SiC-based composite structure capable of improving the manufacturing efficiency of the Si—SiC-based composite structure. The method of manufacturing a Si—SiC-based composite structure includes a step of impregnating a molten metal containing Si into a molded body containing SiC by heating a supply body containing Si under a state in which the supply body is in contact with the molded body, wherein a contact portion of the supply body with the molded body is a part of a surface of the supply body facing the molded body.

12 Claims, 13 Drawing Sheets

(56)    References Cited

FOREIGN PATENT DOCUMENTS

| JP | 2012-211071 | A | 11/2012 |
| JP | 2019-156683 | A | 9/2019 |
| WO | 2011/145387 | A1 | 11/2011 |

OTHER PUBLICATIONS

Japanese Office Action (with English translation) dated Jun. 3, 2025 (Application No. 2022-042702).

Chinese Office Action (with English translation) dated Aug. 13, 2024 (Application No. 202310124177.1).

German Office Action (with English translation) dated Nov. 18, 2025 (Application No. 10 2022 213 327.7).

\* cited by examiner

METHOD OF MANUFACTURING Si-SiC-BASED COMPOSITE STRUCTURE

BACKGROUND OF THE INVENTION

This application claims priority under 35 U.S.C. Section 119 to Japanese Patent Application No. 2022-042702 filed on Mar. 17, 2022 which is herein incorporated by reference.

1. Field of the Invention

The present invention relates to a method of manufacturing a Si—SiC-based composite structure.

2. Description of the Related Art

A Si—SiC-based composite material has excellent thermal conductivity and is expected to be used in various industrial products. As a method of manufacturing a structure formed of such Si—SiC-based composite material (hereinafter referred to as "Si—SiC-based composite structure"), there has been proposed, for example, a technology of impregnating a molten metal containing Si into a body to be impregnated, by placing an impregnation metal supply body containing Si on a SiC-containing body to be impregnated and then heating the resultant to 1,200° C. or more and 1,600° C. or less (see WO2011/145387).

However, in such technology, an impregnation step is performed under a state in which the entire lower surface of the impregnation metal supply body is in contact with the body to be impregnated, and hence the impregnation metal supply body may adhere (stick) to the body to be impregnated. When the impregnation metal supply body adheres (sticks) to the body to be impregnated, the mass, dimensions, performance, and the like of the Si—SiC-based composite material may fall outside an acceptable range. Thus, it is required to remove excess adhesion of the impregnation metal supply body to the body to be impregnated, and products in which the adhesion of the impregnation metal supply body cannot be sufficiently removed have to be discarded. As a result, the yield of the Si—SiC-based composite structure may be decreased.

In addition, there is a risk in that the adhering portion of the impregnation metal supply body to the body to be impregnated may vary depending on the product of the Si—SiC-based composite structure, and it is also difficult to predict the adhering potion of the impregnation metal supply body. Thus, a removal step of an adhesion portion of the impregnation metal supply body to the body to be impregnated may become complicated. Thus, in the technology as described in WO2011/145387, there is room for improvement of the manufacturing efficiency of the Si—SiC-based composite structure.

SUMMARY OF THE INVENTION

The main object of the present invention is to provide a method of manufacturing a Si—SiC-based composite structure capable of improving the manufacturing efficiency of the Si—SiC-based composite structure.

According to at least one embodiment of the present invention, there is provided a method of manufacturing a Si—SiC-based composite structure, including a step of impregnating a molten metal containing Si into a molded body containing SiC by heating a supply body containing Si under a state in which the supply body is in contact with the molded body, wherein a contact portion of the supply body with the molded body is a part of a surface of the supply body facing the molded body.

In one embodiment, the surface of the supply body facing the molded body has a protrusion protruding toward the molded body, and the protrusion is brought into contact with the molded body.

In one embodiment, the protrusion has an arc-shaped cross-section.

In one embodiment, the protrusion has a polygonal pyramid shape.

In one embodiment, the supply body is in contact with the molded body in a plurality of contact portions. In this case, of the plurality of contact portions of the supply body with the molded body, the contact portions adjacent to each other have an interval of 78.5 mm or less.

In one embodiment, the contact portion of the supply body with the molded body linearly extends.

In one embodiment, the molded body has a honeycomb structure.

DESCRIPTION OF THE EMBODIMENTS

Embodiments of the present invention are described below with reference to the drawings. However, the present invention is not limited to the embodiments.

A. Overview of Method of manufacturing Si—SiC-based Composite Structure

Figure 1:
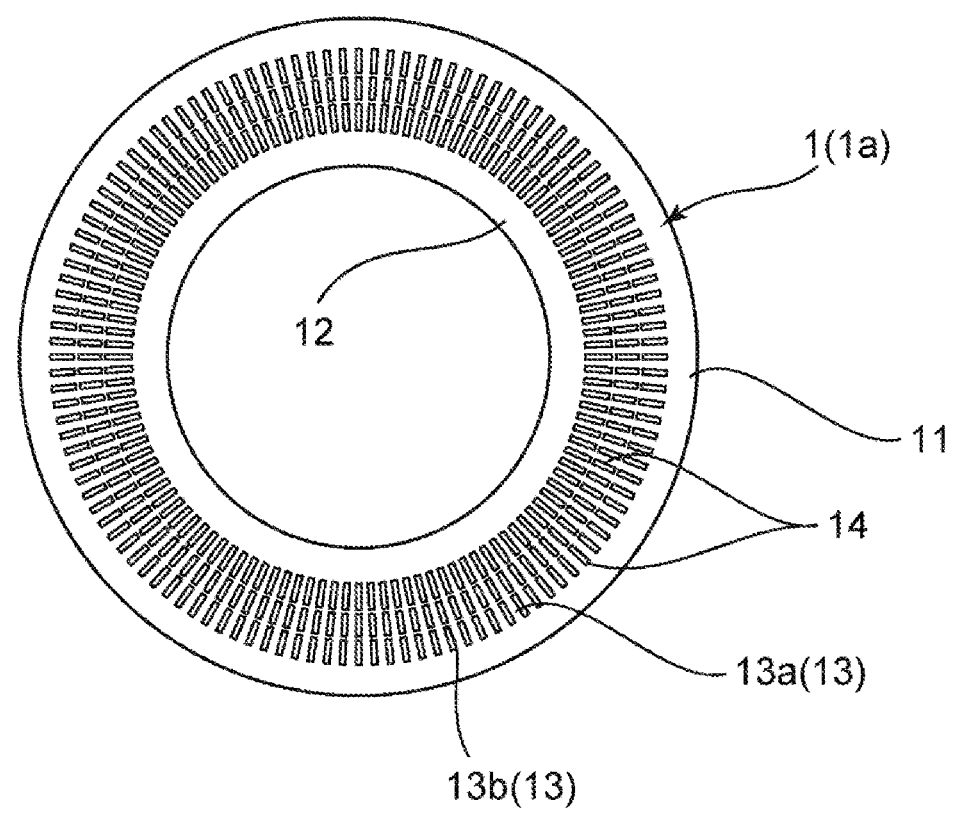
FIG. 1 is a plan view of a molded body in a method of manufacturing a Si—SiC-based composite structure according to one embodiment of the present invention.
Figure 2:
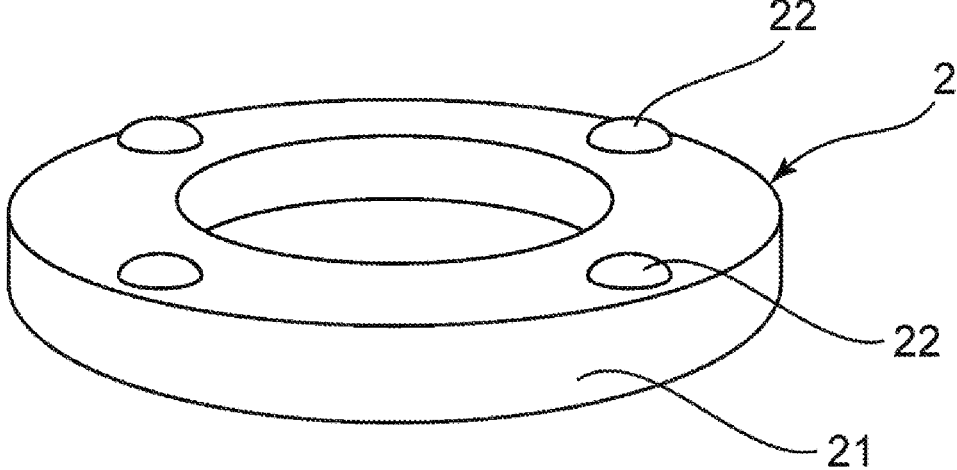
FIG. 2 is a perspective view of a supply body in the method of manufacturing a Si—SiC-based composite structure according to one embodiment of the present invention.
Figure 3:
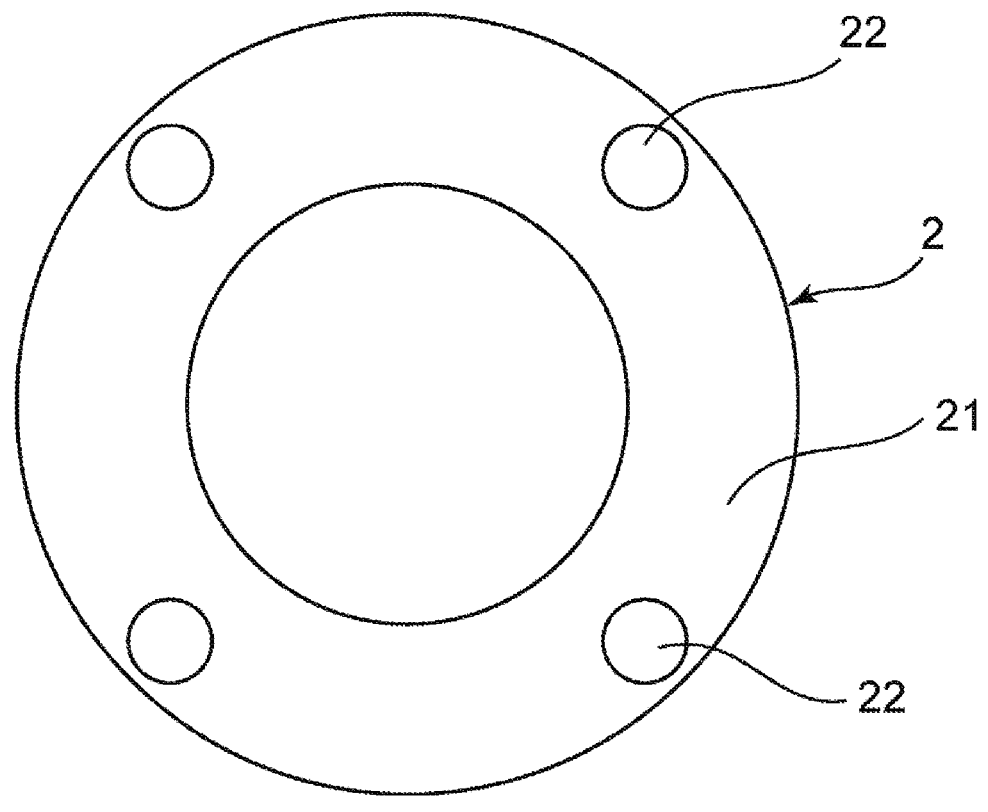
FIG. 3 is a bottom view of the supply body of FIG. 2.
Figure 4:
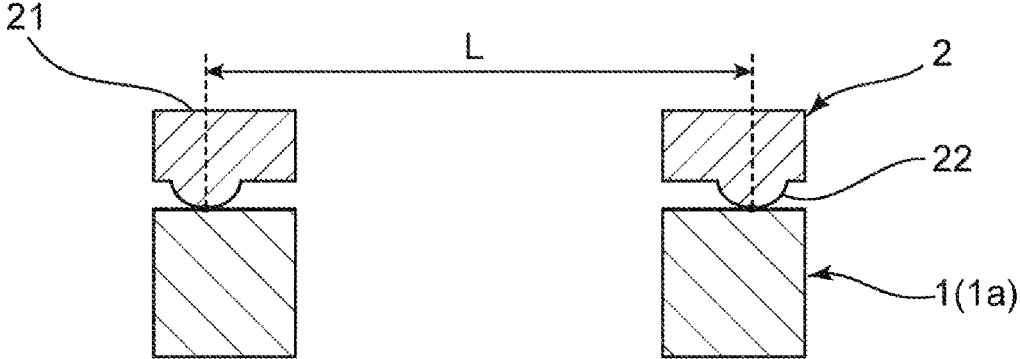
FIG. 4 is a schematic sectional view for illustrating a state in which the supply body of FIG. 2 is in contact with the molded body of FIG. 1.

FIG. 1 is a plan view of a molded body in a method of manufacturing a Si—SiC-based composite structure according to one embodiment of the present invention. FIG. 2 is a perspective view of a supply body in the method of manufacturing a Si—SiC-based composite structure according to one embodiment of the present invention. FIG. 3 is a bottom view of the supply body of FIG. 2. FIG. 4 is a schematic sectional view for illustrating a state in which the supply body of FIG. 2 is in contact with the molded body of FIG. 1.

The method of manufacturing a Si—SiC-based composite structure according to one embodiment of the present invention includes a step of impregnating a molten metal containing Si into a molded body 1 (impregnation step) by heating a supply body 2 containing Si under a state in which the supply body 2 is in contact with the molded body 1. In the impregnation step, a contact portion of the supply body 2 with the molded body 1 is a part of a surface of the supply body 2 facing the molded body 1.

The inventors have found that, when a part of the supply body is in contact with the molded body in the impregnation step, the molten metal containing Si may be impregnated into the entire molded body through the contact portion, and thus the present invention has been completed. According to the above-mentioned method, a part of the surface of the supply body facing the molded body is in contact with the molded body in the impregnation step, and hence the adhesion amount of the supply body to the molded body can be reduced as compared to the case in which the entire surface of the supply body facing the molded body is in contact with the molded body. Thus, the adhesion of the supply body can be easily removed, and the yield of the Si—SiC-based composite structure can be improved. In addition, the portions to which the supply body may adhere can be limited, and hence a removal step of the supply body adhering to the molded body can be smoothly performed. As a result, the manufacturing efficiency of the Si—SiC-based composite structure can be improved.

The molded body is a body to be impregnated into which the molten metal containing Si is impregnated in the impregnation step. The molded body contains SiC as a main component as described above. For example, the term "SiC" as used herein is intended to encompass SiC containing unavoidable impurities as well as pure SiC. The constituent materials for the molded body may also contain Al and/or Si in addition to SiC. The constituent materials for the molded body may also include a molding aid. The content ratio of SiC in the molded body is, for example, 50 mass % or more, preferably 85 mass % or more, and is, for example, 100 mass % or less, preferably 95 mass % or less.

The supply body contains Si as a main component as described above. The constituent materials for the supply body may also contain Al in addition to Si. The constituent materials for the supply body may also include a molding aid.

The content ratio of Si in the supply body is, for example, 50 mass % or more, preferably 90 mass % or more, more preferably 95 mass % or more, and is, for example, 100 mass % or less, preferably 97 mass % or less, more preferably 96 mass % or less. When the content ratio of Si in the supply body falls within such ranges, the molten metal containing Si can be uniformly impregnated into the entire molded body in the impregnation step, and the impregnation amount of Si in the Si—SiC-based composite structure can be made uniform.

In one embodiment, the supply body 2 is in contact with the molded body 1 in a plurality of contact portions. Of the plurality of contact portions of the supply body 2 with the molded body 1, an interval L between the contact portions adjacent to each other is 78.5 mm or less, preferably 70 mm or less, more preferably 60 mm or less. When the interval L between the contact portions adjacent to each other is equal to or less than the above-mentioned upper limit, the molten metal containing Si can be more uniformly impregnated into the entire molded body in the impregnation step, and the generation of a portion insufficiently impregnated with Si (failure of impregnation of Si) can be suppressed in the Si—SiC-based composite structure. As a result, variation in performance of the Si—SiC-based composite structure can be suppressed, and the Si—SiC-based composite structure having excellent performance can be stably manufactured. In particular, when the content ratio of Si in the supply body falls within the above-mentioned ranges, and the interval L between the contact portions adjacent to each other is equal to or less than the above-mentioned upper limit, the impregnation amount of Si in the Si—SiC-based composite structure can be made more uniform. The lower limit of the interval L between the contact portions adjacent to each other is typically 10 mm or more.

In one embodiment, the distance from the contact portion between the supply body and the molded body to the end surface of the molded body is equal to or less than ½ of the interval L. With this configuration, the molten metal containing Si can be more uniformly impregnated into the entire molded body in the impregnation step.

The contact of the supply body 2 with the molded body 1 may be point contact, line contact, or surface contact. When the supply body 2 is in contact with the molded body 1 in a plurality of contact portions, the plurality of contact portions may all be in any one of point contact, line contact, or surface contact, or may be in two or more types of contact among point contact, line contact, and surface contact. When the supply body 2 and the molded body 1 are brought into surface contact with each other, each of the interval L between the contact portions adjacent to each other and the distance between the contact portion and the end surface of the molded body is measured based on an end portion (end edge) of a surface contact portion. For example, the interval L between the surface contact portions adjacent to each other means a distance from an end portion (end edge) of a surface contact portion to an end portion (end edge) of another surface contact portion, and the interval L between a surface contact portion and a point contact portion adjacent to each other means a distance from an end portion (end edge) of the surface contact portion to the point contact portion.

The area of the contact portion between the supply body and the molded body (total of areas of a plurality of contact portions when there are a plurality of contact portions) is, for example, 40% or less, preferably 30% or less when the area of the surface of the supply body facing the molded body is defined as 100%. When the area of the contact portion is equal to or less than the above-mentioned upper limit, the adhesion amount of the supply body to the molded body can be further reduced, and the manufacturing efficiency of the Si—SiC-based composite structure can be further improved. The lower limit of the area of the contact portion is typically 1% or more.

In the impregnation step, typically, the molded body 1 and the supply body 2 are heated under a state in which the supply body 2 containing Si is in contact with the molded body 1 containing SiC. The heating temperature is, for example, 1,200° C. or more, preferably 1,300° C. or more, and is, for example, 1,600° C. or less, preferably 1,500° C. or less. The heating time is, for example, 10 minutes or more, preferably 1 hour or more. When the heating temperature falls within the above-mentioned ranges, and/or the heating time is equal to or more than the above-mentioned lower limit, the molten metal containing Si can be smoothly impregnated into the molded body. The upper limit of the heating time is typically 10 hours or less, preferably 5 hours or less. When the heating time is equal to lower than the above-mentioned upper limit, the manufacturing efficiency of the Si—SiC-based composite structure can be further improved.

The impregnation step is performed preferably under reduced pressure. When the impregnation step is performed under reduced pressure, the molten metal containing Si can be further smoothly impregnated into the molded body. The pressure in the impregnation step is, for example, 500 Pa or less, preferably 300 Pa or less, more preferably 200 Pa or less, and is typically 10 Pa or more. The impregnation step may also be performed under normal pressure (0.1 MPa).

A molded body and a supply body in a method of manufacturing a Si—SiC-based composite structure are described below.

B. Molded Body (Honeycomb Molded Body)

A molded body may have any appropriate shape depending on the application of a Si—SiC-based composite structure. Examples of the shape of the molded body include a columnar shape, an elliptical columnar shape, and a prismatic shape. In addition, the molded body may include a hollow region in a center portion thereof in a cross-section in a direction orthogonal to an axial direction (length direction) of the molded body.

In one embodiment, the molded body is a honeycomb molded body having a honeycomb structure. When the molded body is a honeycomb molded body, the Si—SiC-based composite structure may be a honeycomb structure. The honeycomb molded body has a plurality of cells. The cells extend from a first end surface to a second end surface of the honeycomb molded body in an axial direction (length direction) of the honeycomb molded body. The cells each have any appropriate shape in a cross-section in a direction orthogonal to the axial direction of the honeycomb molded body. As the sectional shape of each of the cells, there are given, for example, a triangular shape, a quadrangular shape, a pentagonal shape, and a polygonal shape of a hexagonal shape or more. All of the cells may be the same in sectional shape and size, or at least some of the cells may be different in sectional shape and size.

The honeycomb molded body in one embodiment is illustrated in FIG. 1. A honeycomb molded body 1a has a columnar shape and includes a hollow region in a center portion thereof. Each of a first end surface (upper surface) and a second end surface (lower surface) of the honeycomb molded body 1a is a flat surface orthogonal to an axial direction of the honeycomb molded body. The outer diameter of the honeycomb molded body may be appropriately set depending on the purpose. The outer diameter of the honeycomb molded body may be, for example, from 20 mm to 200 mm, and for example, from 30 mm to 100 mm. When the sectional shape of the honeycomb molded body is not a circular shape, the diameter of a maximum inscribed circle inscribed in the sectional shape (e.g., a polygonal shape) of the honeycomb molded body may be defined as the outer diameter of the honeycomb structure. The length of the honeycomb molded body may be appropriately set depending on the purpose. The length of the honeycomb molded body may be, for example, from 3 mm to 200 mm, for example, from 5 mm to 100 mm, and for example, from 10 mm to 50 mm.

The honeycomb molded body 1a includes: an outer peripheral wall 11; an inner peripheral wall 12 located on an inner side of the outer peripheral wall 11; and partition walls 13 located between the outer peripheral wall 11 and the inner peripheral wall 12.

The outer peripheral wall 11 has a cylindrical shape. The inner peripheral wall 12 has a cylindrical shape having a diameter smaller than that of the outer peripheral wall 11. The outer peripheral wall 11 and the inner peripheral wall 12 have an axis in common. Each of the thicknesses of the outer peripheral wall 11 and the inner peripheral wall 12 may be appropriately set depending on the application of the honeycomb structure. Each of the thicknesses of the outer peripheral wall 11 and the inner peripheral wall 12 may be, for example, from 0.3 mm to 10 mm, and may be, for example, from 0.5 mm to 5 mm. When the thicknesses of the outer peripheral wall and/or the inner peripheral wall fall within such ranges, the fracture (e.g., flaws and cracks) of the wall caused by an external force can be suppressed.

The partition walls 13 define a plurality of cells 14. More specifically, the partition walls 13 each have a first partition wall 13a extending in a radiation direction from the inner peripheral wall 12 to the outer peripheral wall 11 and a second partition wall 13b extending in a circumferential direction, and the first partition walls 13a and the second partition walls 13b define the plurality of cells 14. The sectional shape of each of the cells 14 is a quadrangular shape (rectangle that is elongated in a radial direction of the honeycomb molded body).

In addition, although not shown, the first partition walls 13a and the second partition walls 13b are orthogonal to each other and may define the cells 14 each having a sectional shape of a quadrangular shape (square shape) except for portions in which the first partition walls 13a and the second partition walls 13b are in contact with the inner peripheral wall 12 and the outer peripheral wall 11.

The cell density (i.e., the number of the cells 14 per unit area) in the cross-section in the direction orthogonal to the axial direction of the honeycomb molded body may be appropriately set depending on the purpose. The cell density may be, for example, from 4 cells/cm$^2$ to 320 cells/cm$^2$. When the cell density falls within such range, the strength and effective geometric surface area (GSA) of the honeycomb structure can be sufficiently ensured.

The thickness of each of the partition walls 13 may be appropriately set depending on the application of the honeycomb structure. The thickness of each of the partition walls 13 is typically smaller than the thickness of each of the outer peripheral wall 11 and the inner peripheral wall 12. The thickness of each of the partition walls 13 may be, for example, from 0.1 mm to 1.0 mm, or, for example, from 0.2 mm to 0.6 mm. When the thickness of each of the partition walls falls within such range, the honeycomb structure having sufficient mechanical strength can be obtained. In addition, a sufficient opening area (total area of the cells in the cross section) can be obtained.

The porosity in each of the outer peripheral wall 11, the inner peripheral wall 12, and the partition walls 13 may be appropriately set depending on the purpose. The porosity thereof is, for example, 15% or more, preferably 20% or more, and is, for example, 50% or less, preferably 45% or less. The porosity may be measured, for example, by mercury porosimetry. When the porosity in the outer peripheral wall, the inner peripheral wall, and the partition walls falls within such ranges, a molten metal can be impregnated into the honeycomb molded body through use of a capillary force in an impregnation step.

The density (density of molded body) in each of the outer peripheral wall 11, the inner peripheral wall 12, and the partition walls 13 may be appropriately set depending on the purpose. The density thereof is, for example, 1.7 g/cm$^3$ or more, preferably 1.8 g/cm$^3$ or more, and is, for example, 2.6 g/cm$^3$ or less, preferably 2.8 g/cm$^3$ or less. The density may be measured, for example, by mercury porosimetry. When the density of each of the outer peripheral wall, the inner peripheral wall, and the partition walls falls within such ranges, voids can be formed inside the outer peripheral wall, the inner peripheral wall, and the partition walls with the porosity described above.

Such molded body (honeycomb molded body) may be produced by the following method. First, a binder, water, or an organic solvent are added to inorganic material powder including SiC powder, and the resultant mixture is kneaded to form a plastic matter. The plastic matter is molded (typically extrusion-molded) into a desired shape and dried to produce a dry body (honeycomb dry body). Next, the dry body (honeycomb dry body) is subjected to predetermined outer shape processing, and thus a molded body (honeycomb molded body) having a desired shape can be obtained.

C. Supply Body

A supply body may have any appropriate shape depending on the shape of the molded body. The supply body has, for example, a plate shape having a predetermined thickness. Examples of the sectional shape of the supply body in a direction orthogonal to the thickness direction include a circular shape, an elliptical shape, and a polygonal shape. In addition, the supply body may include a hollow region in a center portion of a cross-section thereof. The supply body including the hollow region has a so-called doughnut shape.

In one embodiment, the supply body has protrusions. The supply bodies having protrusions are illustrated in FIG. 2 to FIG. 8.

As illustrated in FIG. 2 and FIG. 3, the supply body 2 includes: a main body 21 having a disc shape (annular plate shape) including a hollow region in a center portion thereof; and a plurality of protrusions 22 each protruding from the main body 21.

The thickness of the main body 21 may be appropriately set depending on the purpose. The thickness of the main body 21 may be, for example, from 5 mm to 25 mm, and for example, from 8 mm to 15 mm.

The plurality of protrusions 22 are formed on one surface of the main body 21 in a thickness direction. The plurality of protrusions 22 are typically arranged at equal intervals in a circumferential direction of the main body 21. The number of the protrusions 22 is four in the illustrated example, but is not limited thereto. The number of the protrusions 22 may be, for example, from 4 or more and 20 or less, and for example, from 4 or more and 10 or less. The protruding length (dimension in the thickness direction of the main body) of each of the protrusions 22 may be appropriately set depending on the purpose. The protruding length of each of the protrusions 22 may be, for example, from 0.5 mm to 5 mm, and for example, from 1 mm to 3 mm. As illustrated in FIG. 4, the protrusion 22 has an arc shape in cross-section in the thickness direction of the main body 21 (arc-shaped cross-section). In one embodiment, the protrusion may have a hemispherical shape. When the protrusion has an arc-shaped cross-section, chipping is less liable to occur in the protrusion at the time of manufacturing (in particular, press molding) of the supply body. Thus, the shape stability at the time of manufacturing of the supply body can be expected.

In the impregnation step, the supply body 2 is placed on the molded body 1 (honeycomb molded body 1*a*) so that the protrusions 22 are brought into contact with the first end surface of the molded body 1 (honeycomb molded body 1*a*). In this state, the surface of the supply body 2 including the protrusions 22 faces the molded body 1 (honeycomb molded body 1*a*), and the protrusions 22 protrude from the main body 21 toward the molded body 1. A part (specifically, an apex of an arc) of each of the protrusions 22 is in contact with the first end surface of the molded body 1 (honeycomb molded body 1*a*).

Figures 5A, 5B:
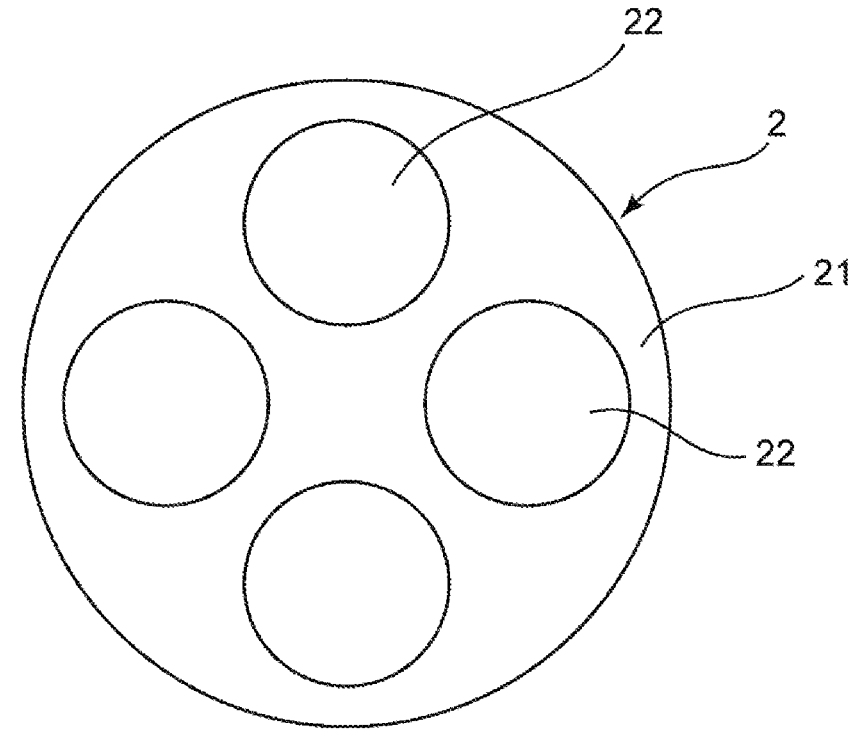
FIG. 5A is a bottom view of a supply body in another embodiment of the present invention.
FIG. 5B is a schematic sectional view for illustrating a state in which the supply body of FIG. 5A is in contact with the molded body.
Figure 6A:
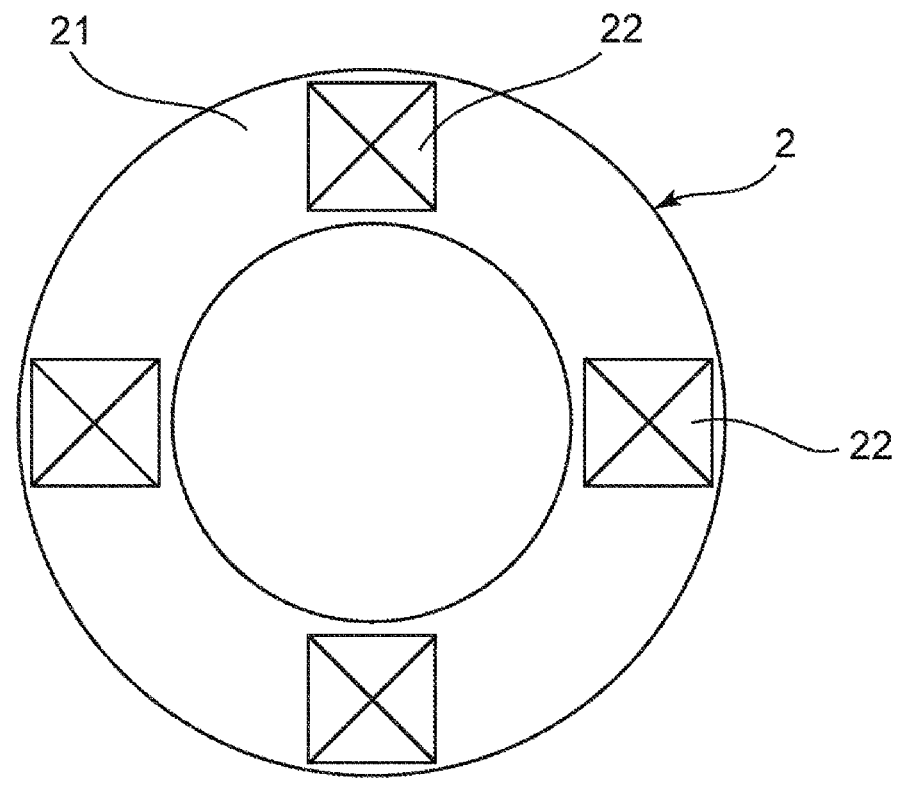
FIG. 6A is a bottom view of a supply body in still another embodiment of the present invention.
Figure 6B:
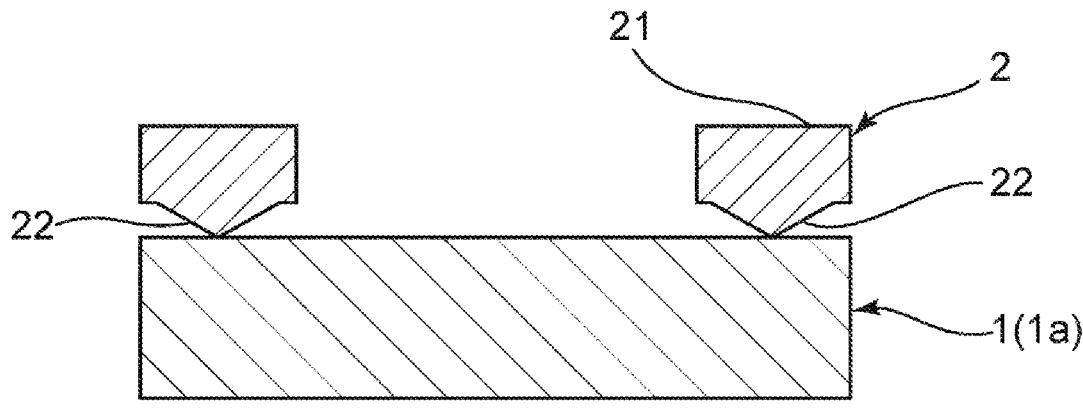
FIG. 6B is a schematic sectional view for illustrating a state in which the supply body of FIG. 6A is in contact with the molded body.
Figure 7A:
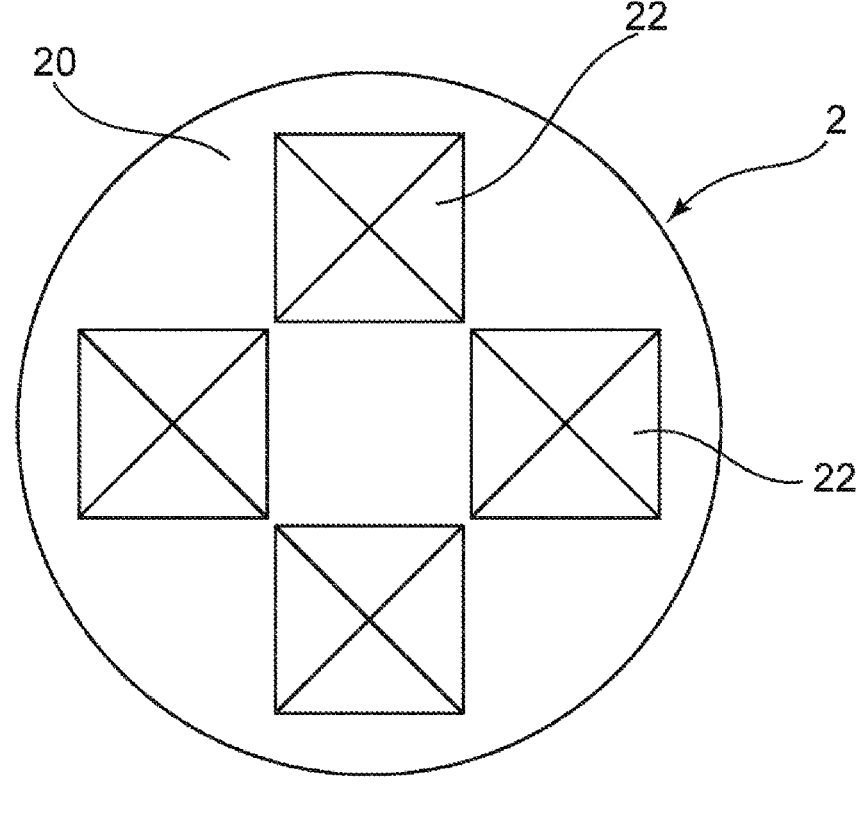
FIG. 7A is a bottom view of a supply body in still another embodiment of the present invention.
Figure 7B:
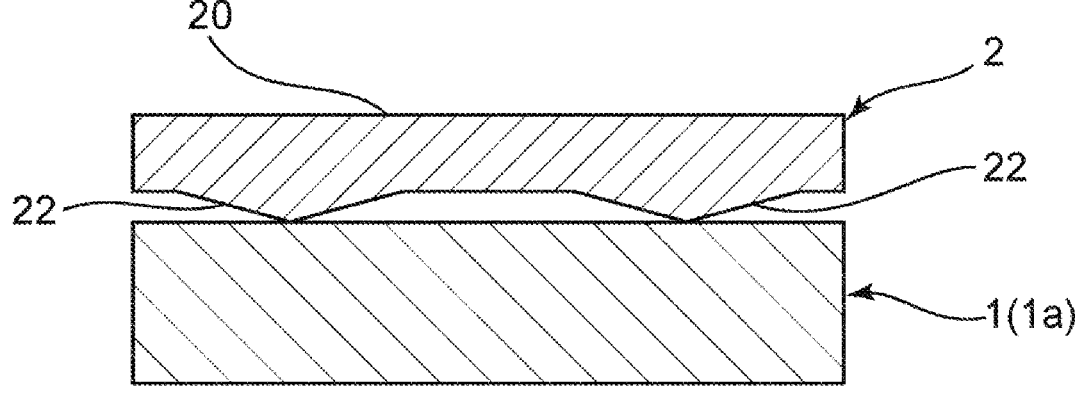
FIG. 7B is a schematic sectional view for illustrating a state in which the supply body of FIG. 7A is in contact with the molded body.

As illustrated in FIG. 5A and FIG. 5B, the main body 21 is not required to include the hollow region. In addition, the size of each of the protrusions 22 is not particularly limited.

As illustrated in FIG. 6A and FIG. 6B and FIG. 7A and FIG. 7B, the protrusions 22 may each have a polygonal pyramid shape. When the protrusions each have a polygonal pyramid shape, the contact positions with the molded body can be accurately set as compared to the case in which the protrusions each have an arc-shaped cross-section. Thus, the portions to which the supply body may adhere can be accurately controlled, and the removal step of the supply body adhering to the molded body can be more smoothly performed. Examples of the polygonal pyramid shape include a triangular pyramid, a quadrangular pyramid, and a polygonal pyramid of a pentagonal pyramid or more. The angle of the apex of the protrusion having a polygonal pyramid shape may be set to any appropriate value.

Figure 8:
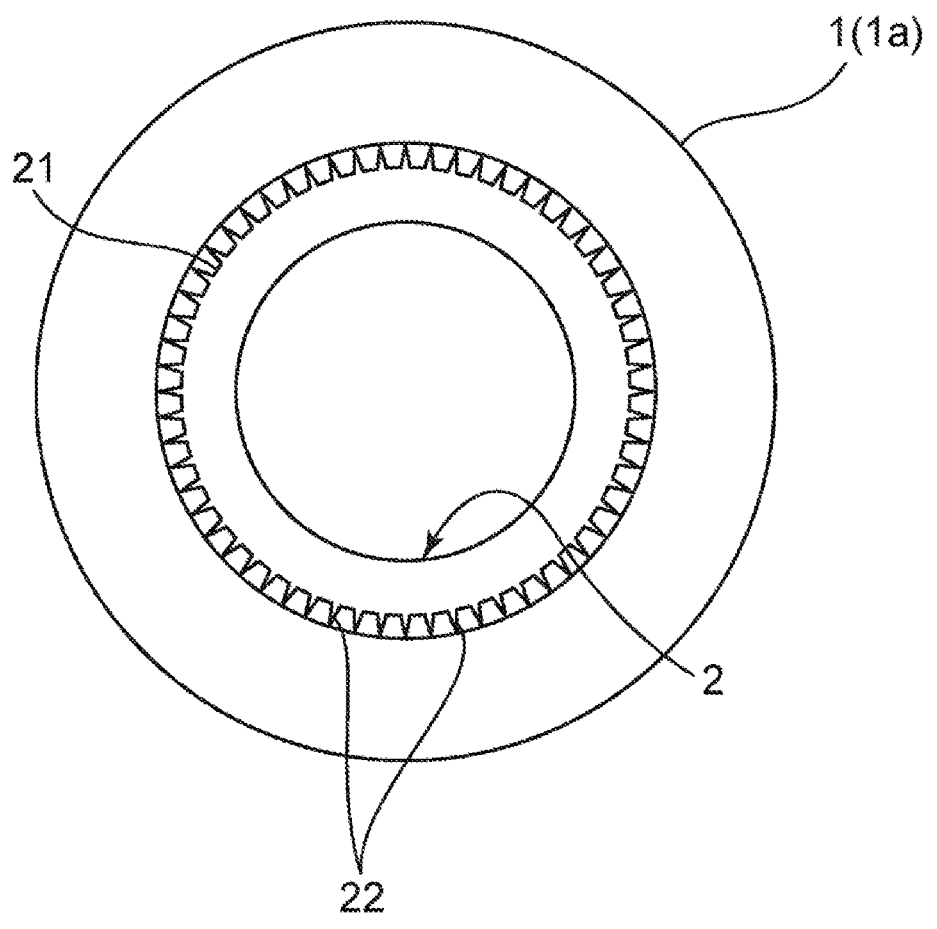
FIG. 8 is a schematic plan view for illustrating a state in which a supply body in still another embodiment of the present invention is in contact with the molded body.

As illustrated in FIG. 8, the main body 21 may have a columnar shape (cylindrical shape) including a hollow region in a center portion thereof, and the protrusions 22 may be formed on an outer peripheral surface of the main body 21. In this case, the molded body 1 (honeycomb molded body 1*a*) includes a hollow region. In the impregnation step, the supply body 2 is arranged in the hollow region of the molded body 1 (honeycomb molded body 1*a*), and the protrusions 22 are brought into contact with an inner peripheral surface of the molded body 1 (honeycomb molded body 1*a*).

In one embodiment, the contact portion of the supply body with the molded body linearly extends. Supply bodies each capable of being brought into contact with the molded body in a linear shape are illustrated in FIG. 9A to FIG. 11B. In the case in which the contact portion of the supply body with the molded body linearly extends, even when breakage such as chipping occurs in a part of the contact portion, the contact area between the supply body and the molded body can be sufficiently ensured, and the occurrence of failure of impregnation of Si in the Si—SiC-based composite structure can be stably controlled.

Figure 9A:
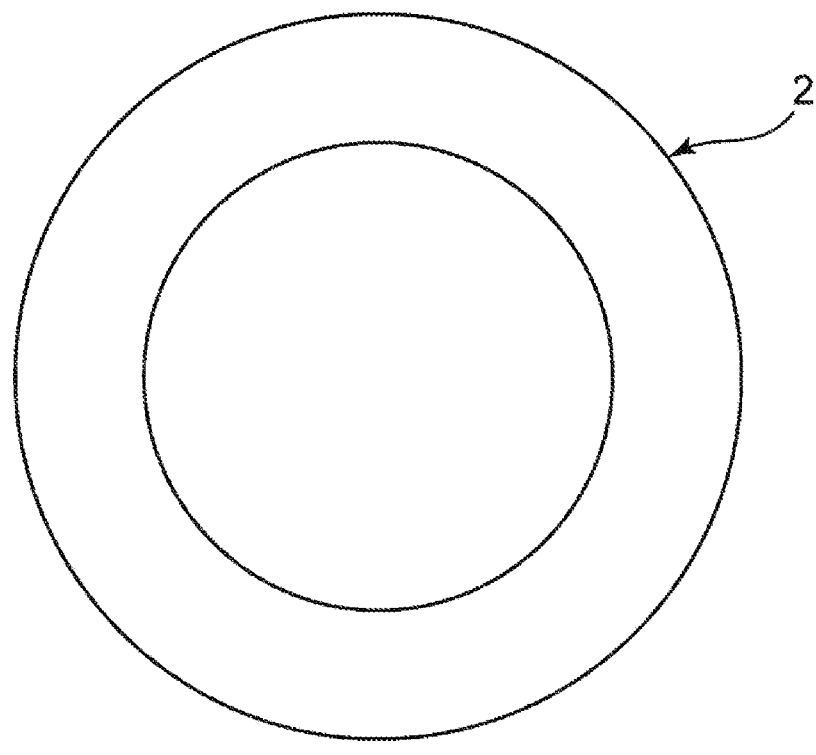
FIG. 9A is a bottom view of a supply body in still another embodiment of the present invention.
Figure 9B:
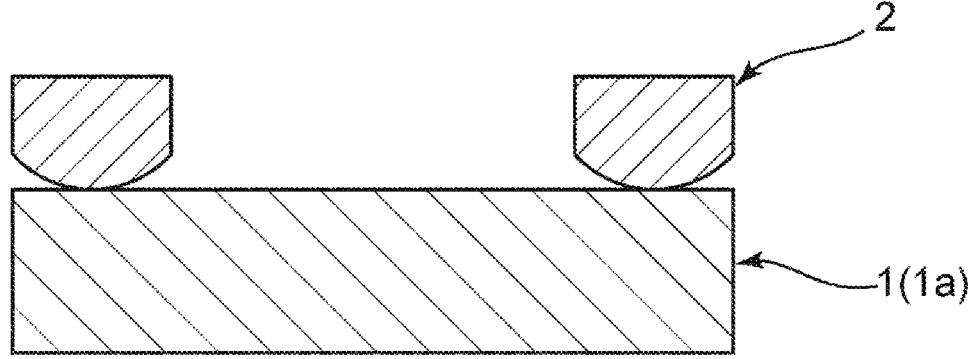
FIG. 9B is a schematic sectional view for illustrating a state in which the supply body of FIG. 9A is in contact with the molded body.

As illustrated in FIG. 9A and FIG. 9B, the supply body 2 has a so-called doughnut shape. The surface of the supply body 2 facing the molding body 1 has an arc shape in cross-section in the thickness direction (arc-shaped cross-section). The surface having an arc-shaped cross-section extends entirely in the circumferential direction of the supply body 2. In the impregnation step, a part (specifically, an apex) of the surface having an arc-shaped cross-section of the supply body 2 is brought into contact with the molded body 1 (honeycomb molded body 1*a*) in a linear shape extending in the circumferential direction of the supply body.

Figure 10A:
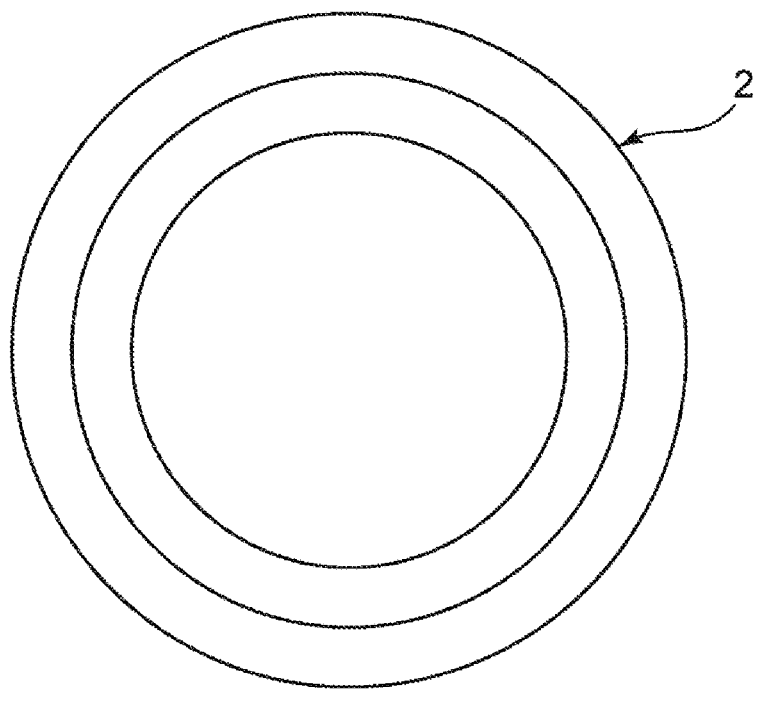
FIG. 10A is a bottom view of a supply body in still another embodiment of the present invention.
Figure 10B:
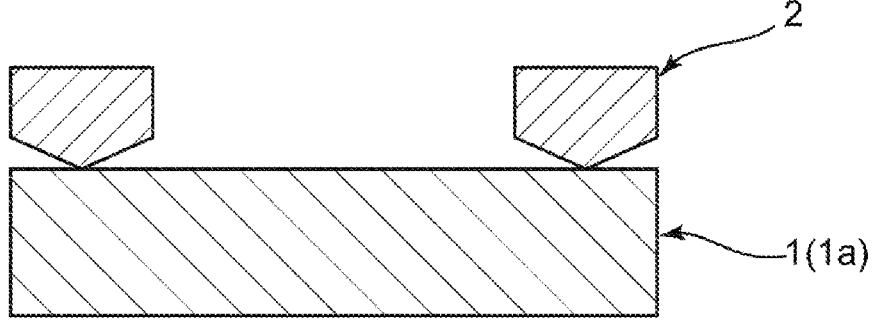
FIG. 10B is a schematic sectional view for illustrating a state in which the supply body of FIG. 10A is in contact with the molded body.

In addition, as illustrated in FIG. 10A and FIG. 10B, the surface of the supply body 2 facing the molded body 1 may have a V-shape in cross-section in the thickness direction (V-shaped cross-section). The angle of an apex of the surface having a V-shaped cross-section may be set to any appropriate value.

Figure 11A:
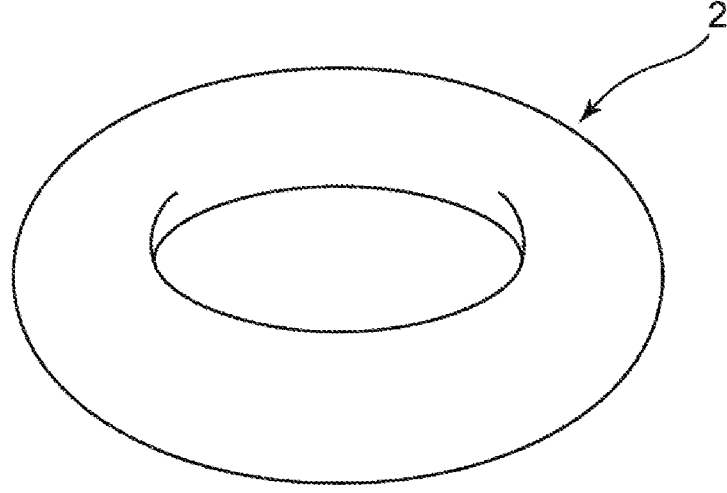
FIG. 11A is a bottom view of a supply body in still another embodiment of the present invention.
Figure 11B:
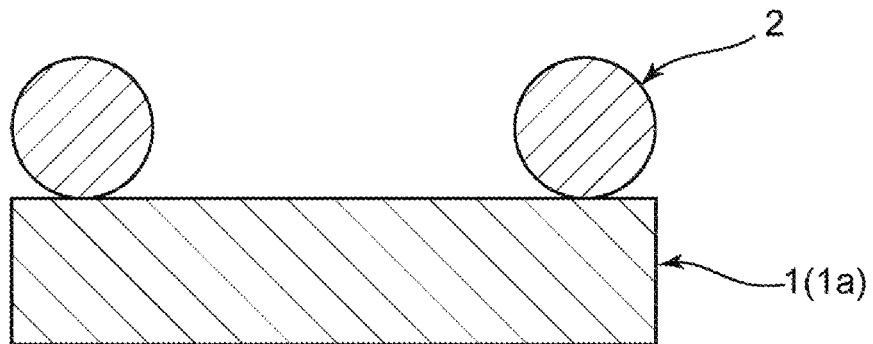
FIG. 11B is a schematic sectional view for illustrating a state in which the supply body of FIG. 11A is in contact with the molded body.

In the configurations illustrated in FIG. 9A and FIG. 9B and FIG. 10A and FIG. 10B, respectively, the supply body 2 includes a hollow region, but is not required to include the hollow region. In this case, although not shown, a portion of the supply body including the surface having the above-mentioned specific sectional shape (arc-shaped cross-section or V-shaped cross-section) protrudes from a peripheral end portion of the main body having a disc shape and may correspond to a protrusion. In addition, as illustrated in FIG. 11A and FIG. 11B, the supply body 2 may have a circular cross-section.

Such supply body may be produced by the following method. Material powder containing Si powder is formed into a desired shape (typically by press forming) and then dried to provide a supply body having the desired shape.

In the above-mentioned embodiments, the supply body having the above-mentioned specific structure (protrusion, arc-shaped cross-section, or V-shaped cross-section) is brought into contact with the flat first end surface of the molded body, but the present invention is not limited thereto. For example, a protrusion may be formed on the molded body, and the protrusion may be brought into contact with a flat end surface of the supply body. Also with this configuration, a part of the surface of the supply body facing the molded body may be brought into contact with the molded body.

In addition, in the above-mentioned embodiments, the supply body and the molded body are in direct contact with each other, but the supply body and the molded body may be in contact with each other via a relay member. In this case, the contact portion of the supply body with the molded body means a contact portion of the supply body with the relay member. Also with this configuration, the adhesion amount of the supply body to the molded body can be reduced. The relay member is separate from each of the supply body and the molded body, and typically has the same shape as that of the above-mentioned protrusion. In one embodiment, in the impregnation step, the relay member is sandwiched between the flat first end surface of the molded body and the flat end surface of the supply body. As a consistent material for the relay member, there are given, for example, a constituent material for the above-mentioned molded body, a constituent material for the above-mentioned supply member, and a precursor material of SiC (e.g., carbon).

EXAMPLES

Now, the present invention is specifically described by way of Examples. However, the present invention is not limited to these Examples.

Example 1

1. Production of Honeycomb Molded Body

A plastic matter containing SiC powder and molding aid powder was extrusion-molded into the shape illustrated in FIG. 1 and then dried to provide a honeycomb dry body. Then, the honeycomb dry body was subjected to outer surface processing to provide a honeycomb molded body. The honeycomb molded body had an outer peripheral wall (outer diameter: 86 mm), an inner peripheral wall (inner diameter: 66 mm) located on an inner side of the outer peripheral wall, and partition walls that were located between the outer peripheral wall and the inner peripheral wall and defined a plurality of cells. The cell density in the honeycomb molded body was 56 cells/$cm^2$, the thickness of each of the partition walls was 0.3 mm, and the thickness of each of the outer peripheral wall and the inner peripheral wall was 2 mm.

2. Production of Supply Body

Material powder containing Si powder and molding aid powder was press-formed into the shape illustrated in FIG. 2 and then dried to provide a supply body. The supply body had a main body (inner diameter: 41 mm, outer diameter: 73 mm, thickness: 10 mm) having an annular plate shape and four protrusions protruding from the main body.

3. Impregnation Step

Next, as illustrated in FIG. 4, the supply body was placed on the honeycomb molded body so that the protrusions of the supply body were brought into contact with the honeycomb molded body. After that, the resultant was heated at 1,500° C. for 4 hours under reduced pressure conditions (200 Pa), to thereby impregnate a molten metal containing Si into the honeycomb molded body. Of contact portions between the protrusions and the honeycomb molded body, an interval between the contact portions adjacent to each other was 54 mm.

Figure 12:
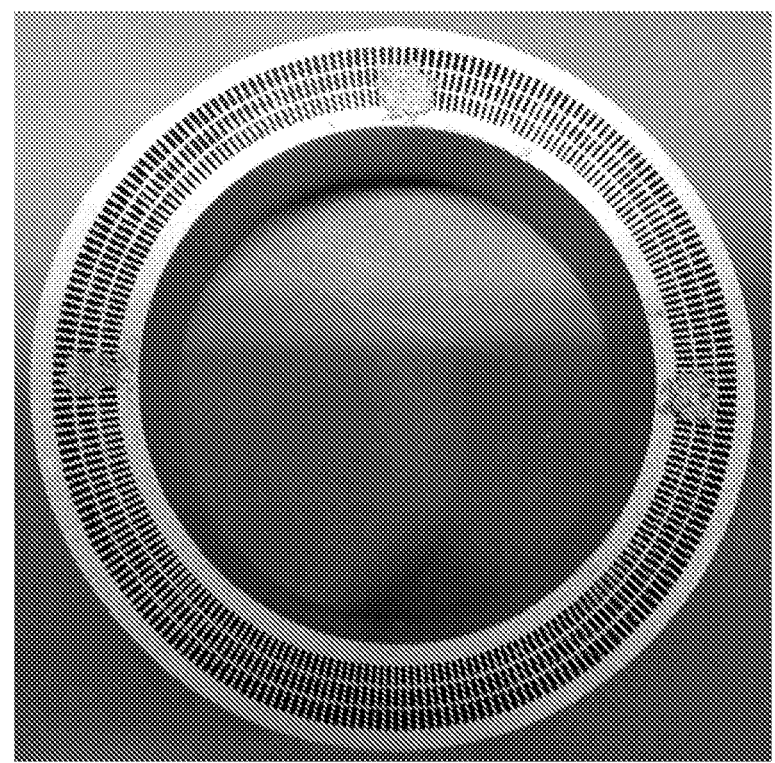
FIG. 12 is a plan view photograph of a honeycomb structure obtained in Example 1.

In the manner described above, a honeycomb structure (Si—SiC-based composite structure) was obtained. After that, the honeycomb structure was cooled to a room temperature (23° C.), and the adhesion state of the supply body to the honeycomb structure was checked. In FIG. 12, a plan view photograph of the honeycomb structure obtained in Example 1 is shown.

Comparative Example 1

Figure 13:
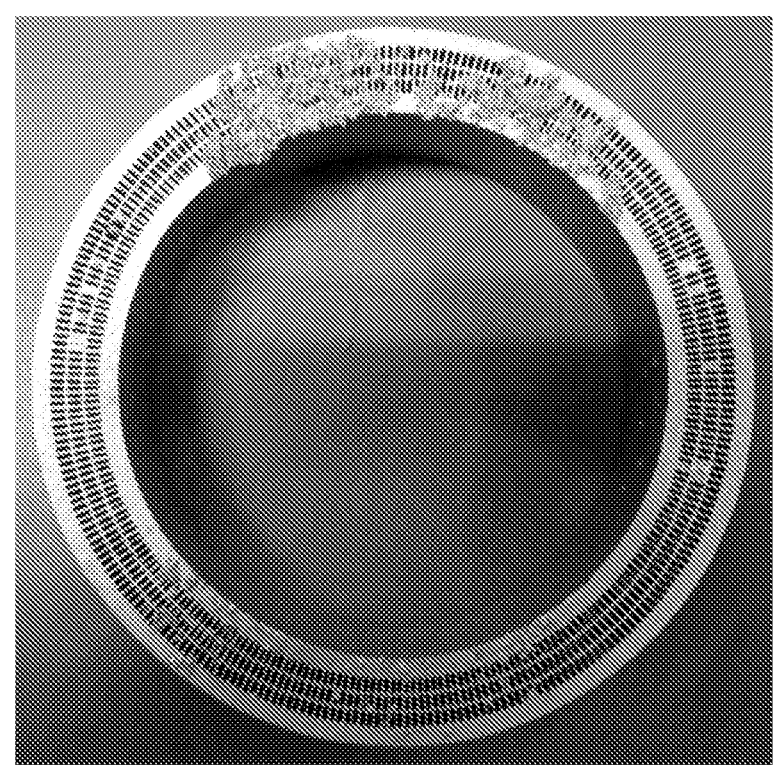
FIG. 13 is a plan view photograph of a honeycomb structure obtained in Comparative Example 1.

A honeycomb structure (Si—SiC-based composite structure) was obtained in the same manner as in Example 1 except that the supply body did not have the protrusions, and the entire lower surface of the supply body was brought into contact with the honeycomb molded body in the impregnation step. After that, the honeycomb structure was cooled to a room temperature (23° C.), and the adhesion state of the supply body to the honeycomb structure was recognized. In FIG. 13, a plan view photograph of the honeycomb structure obtained in Comparative Example 1 is shown.

As is apparent from FIG. 12 and FIG. 13, when the contact portion of the supply body with the honeycomb molded body is formed as a part of the surface facing the molded body in the impregnation step, the adhesion (sticking) amount of the supply body to the honeycomb structure can be reduced, and the adhering (sticking) portion can be limited.

The method of manufacturing a Si—SiC-based composite structure according to at least one embodiment of the present invention is used in manufacturing of various industrial products, and may be suitably used, in particular, in manufacturing of a heat exchanger.

According to the at least one embodiment of the present invention, the method of manufacturing a Si—SiC-based composite structure capable of improving the manufacturing efficiency of the Si—SiC-based composite structure can be obtained.

What is claimed is:

1. A method of manufacturing a Si-SiC-based composite structure, comprising a step of impregnating a molten metal containing Si into a molded body containing SiC by heating a supply body containing Si under a state in which the supply body is in contact with the molded body, wherein a contact portion of the supply body with the molded body is a part of a surface of the supply body facing the molded body, wherein the Si content of the supply body is from 90 mass % to 100 mass %.

2. The method of manufacturing a Si-SiC-based composite structure according to claim 1, wherein the surface of the supply body facing the molded body has a protrusion protruding toward the molded body, and wherein the protrusion is brought into contact with the molded body.

3. The method of manufacturing a Si-SiC-based composite structure according to claim 2, wherein the protrusion has an arc-shaped cross-section.

4. The method of manufacturing a Si-SiC-based composite structure according to claim 2, wherein the protrusion has a polygonal pyramid shape.

5. The method of manufacturing a Si-SiC-based composite structure according to claim 1, wherein the supply body is in contact with the molded body in a plurality of contact portions, and wherein, of the plurality of contact portions of the supply body with the molded body, the contact portions adjacent to each other have an interval of 78.5 mm or less.

6. The method of manufacturing a Si-SiC-based composite structure according to claim 1, wherein the contact portion of the supply body with the molded body linearly extends.

7. The method of manufacturing a Si-SiC-based composite structure according to claim 1, wherein the molded body has a honeycomb structure.

8. A method of manufacturing a Si-SiC-based composite structure, comprising a step of impregnating a molten metal containing Si into a molded body containing SiC by heating a supply body containing Si under a state in which the supply body is in contact with the molded body, wherein a contact portion of the supply body with the molded body is a part of a surface of the supply body facing the molded body, wherein the surface of the supply body facing the molded body has a protrusion protruding toward the molded body, wherein the protrusion is brought into contact with the molded body, wherein the supply body is in contact with the molded body in a plurality of contact portions, wherein, of the plurality of contact portions of the supply body with the molded body, the contact portions adjacent to each other have an interval of 78.5 mm or less, and wherein the molded body has a honeycomb structure, wherein the Si content of the supply body is from 90 mass % to 100 mass %.

9. The method of manufacturing a Si-SiC-based composite structure according to claim 8, wherein the protrusion has an arc-shaped cross-section.

10. The method of manufacturing a Si-SiC-based composite structure according to claim 8, wherein the protrusion has a polygonal pyramid shape.

11. The method of manufacturing a Si-SiC-based composite structure according to claim 8, wherein the contact portion of the supply body with the molded body linearly extends.

12. The method of manufacturing a Si-SiC-based composite structure according to claim 1, wherein an area of contact between the supply body and the molded body is from 1% to 40%.

* * * * *